US010926960B2

(12) United States Patent
Shin et al.

(10) Patent No.: US 10,926,960 B2
(45) Date of Patent: Feb. 23, 2021

(54) OVERHEAD CONVEYANCE VEHICLE

(71) Applicant: DAIFUKU CO., LTD., Osaka (JP)

(72) Inventors: Takeshi Shin, Shiga (JP); Tetsuji Nakae, Shiga (JP)

(73) Assignee: DAIFUKU CO., LTD., Osaka (JP)

( * ) Notice: Subject to any disclaimer, the term of this patent is extended or adjusted under 35 U.S.C. 154(b) by 0 days.

(21) Appl. No.: 16/737,165

(22) Filed: Jan. 8, 2020

(65) Prior Publication Data
US 2020/0223640 A1 Jul. 16, 2020

(30) Foreign Application Priority Data
Jan. 10, 2019 (JP) .............................. JP2019-002268

(51) Int. Cl.
*B65G 43/02* (2006.01)
*H01L 21/67* (2006.01)
*B65G 43/08* (2006.01)
*B65G 49/07* (2006.01)
*B61B 3/02* (2006.01)
*B65G 35/06* (2006.01)
*B66C 15/04* (2006.01)

(52) U.S. Cl.
CPC ............... *B65G 43/02* (2013.01); *B61B 3/02* (2013.01); *B65G 35/06* (2013.01); *B65G 43/08* (2013.01); *B65G 49/07* (2013.01); *H01L 21/67259* (2013.01); *B65G 2201/0297* (2013.01); *B65G 2203/0283* (2013.01); *B65G 2203/044* (2013.01); *B66C 15/04* (2013.01)

(58) Field of Classification Search
CPC ............ B65G 2201/0297; B65G 43/02; B65G 43/08; B65G 35/06; B65G 49/07; H01L 21/67259; B66C 15/04; B61B 3/02
USPC .......................................... 198/678.1, 687.1
See application file for complete search history.

(56) References Cited

U.S. PATENT DOCUMENTS

| 6,802,413 | B2 * | 10/2004 | Ito | ...................... B65G 17/20 198/465.1 |
|---|---|---|---|---|
| 2003/0001118 | A1 | 1/2003 | Murata | |
| 2016/0240417 | A1 * | 8/2016 | Tomida | ............. H01L 21/67736 |
| 2018/0158708 | A1 * | 6/2018 | Kuo | ......................... B66C 1/62 |
| 2020/0020559 | A1 * | 1/2020 | Kobayashi | ........ H01L 21/67721 |
| 2020/0118853 | A1 * | 4/2020 | Harasaki | ..................... G06T 7/70 |
| 2020/0176294 | A1 * | 6/2020 | Chen | ................. H01L 21/67706 |
| 2020/0251366 | A1 * | 8/2020 | Wada | ....................... B65G 1/04 |

FOREIGN PATENT DOCUMENTS

JP 3371897 B2 11/2002

* cited by examiner

*Primary Examiner* — James R Bidwell
(74) *Attorney, Agent, or Firm* — Kusner & Jaffe

(57) ABSTRACT

In an overhead conveyance vehicle that travels along a rail serving as a conveyance track mounted on a ceiling and conveys a target magazine along the rail, when an elevating unit holding the magazine is hoisted or lowered between a conveyance position and a transfer position, a controller for controlling the operation of the overhead conveyance vehicle determines, based on an image captured by a camera, the presence or absence of an obstacle in an imaging range captured by the camera.

11 Claims, 4 Drawing Sheets

OVERHEAD CONVEYANCE VEHICLE

FIELD OF THE INVENTION

The present invention relates to an overhead conveyance vehicle and particularly relates to an overhead conveyance vehicle including an elevating unit capable of hoisting and lowering an article to be conveyed, the article being conveyed along a conveyance track.

BACKGROUND OF THE INVENTION

Conventionally, as a kind of conveyance apparatus used in a semiconductor-device manufacturing facility such as a clean room, an overhead conveyance vehicle (overhead conveyor) that conveys an article along a conveyance track mounted on the ceiling of the facility is available as described in Japanese Patent No. 3371897. The overhead conveyance vehicle includes a hoist carriage that can hoist and lower a semiconductor wafer carrier between the load port of semiconductor manufacturing equipment and the ceiling.

In the overhead conveyance vehicle described in Japanese Patent No. 3371897, an optical obstacle sensor is provided to check the presence or absence of an obstacle in a hoisting/lowering path when the wafer carrier is hoisted or lowered.

The obstacle sensor emits light in a predetermined detection range so as to check the presence or absence of an obstacle in the detection range based on the amount of reflected light etc.

In the optical obstacle sensor provided for the overhead conveyance vehicle as described in Japanese Patent No. 3371897, however, a light beam cannot be emitted all over the somewhat widened detection range at once by a single light source. Thus, after the completion of detection at one point, another point is detected at a different radiation angle during the detection of an obstacle. This operation is to be repeated again and again.

A change of the radiation angle of the light source requires a mechanical motion using a driving mechanism, e.g., a motor, thereby wearing a device mechanism by friction or the like in each use. Thus, unfortunately, the obstacle sensor of the related art includes a mechanism having a short life.

In addition, an ordinary optical obstacle sensor has a projection pitch (a switching width of a radiation angle) fixed at a certain angle (changeable only by a certain angle) and thus unfortunately, a small obstacle fitting into the middle of the projection pitch cannot be detected.

Moreover, according to the optical obstacle sensor of the related art, light is emitted downward to the load port placed distance from the obstacle sensor arranged on the ceiling side. Thus, even a small deviation of a radiation angle may considerably displace a radiation point, thereby interfering with light emission to a desired point. Hence, in the related art, precise optical axis alignment is required for a light source. If an optical axis is misaligned, an operator has to climb up to the ceiling of a facility to align the optical axis at a high place, disadvantageously leading to quite a lot of work. As described above, the optical obstacle sensor of the related art is handled with difficulty in some aspects. In view of the problems, an object of the present invention is to provide an overhead conveyance vehicle provided with a mechanism for determining the presence or absence of an obstacle with greater ease of handling.

SUMMARY OF THE INVENTION

In order to solve the problems, in an example of an embodiment of an overhead conveyance vehicle according to the present invention, the overhead conveyance vehicle that travels along a conveyance track mounted on a ceiling and conveys a target article along the conveyance track includes a carriage that runs along the conveyance track; a body that moves with the carriage along the conveyance track; an elevating unit that is provided in the body and is capable of moving up and down between a conveyance position and a transfer position below the conveyance position; an imaging device that captures an image below the body; and a controller that controls the operation of the overhead conveyance vehicle, wherein the elevating unit is capable of performing a catching operation so as to move down to the transfer position and hold the article placed on an article mount below the conveyance position and a releasing operation so as to move down with the article held at the conveyance position to the transfer position and place the article on the article mount, and when controlling the elevating unit to perform one of the catching operation and the releasing operation, the controller determines, based on the image captured by the imaging device, the presence or absence of an obstacle in an imaging range captured by the imaging device.

When controlling the elevating unit to perform one of the catching operation and the releasing operation, the controller preferably searches the image captured by the imaging device for a plurality of predetermined indicators and sets, with reference to the positions of the indicators, a monitoring range for determining the presence or absence of an obstacle.

When controlling the elevating unit to perform one of the catching operation and the releasing operation, the controller preferably searches the image captured by the imaging device for a shape similar to a predetermined standardized shape, defines the shape as an indicator part, and sets, with reference to the position of the indicator part, a monitoring range for determining the presence or absence of an obstacle.

It is preferable that an image captured by the imaging device at the start of one of the catching operation and the releasing operation is set as a reference image while an image captured by the imaging device during one of the catching operation and the releasing operation is set as an operation image, and if a difference larger than a predetermined threshold value is made between image data in the monitoring range in the reference image and image data in the monitoring range in the operation image, the controller determines that an obstacle is present in the imaging range.

When controlling the elevating unit to perform one of the catching operation and the releasing operation, the controller preferably records the image captured by the imaging device with the imaging time of the image.

According to the example of the embodiment of the overhead conveyance vehicle of the present invention, the presence or absence of an obstacle is determined based on an image captured by the imaging device. This eliminates the need for a driving mechanism for switching the radiation angles of a light source as in the optical obstacle sensor of the related art, achieving an obstacle determination mechanism with a long life.

Moreover, the imaging device captures all objects included in the imaging range of the device, thereby detecting small obstacles that may be undetectable by the optical obstacle sensor of the related art.

Furthermore, it is not necessary to precisely set the orientation of the imaging device as long as a captured image includes the transfer position and an area around the transfer position. This eliminates the need for an operation that involves a lot of work and effort unlike in the optical obstacle sensor of the related art. For example, an operator does not have to climb up to a high place to manually adjust the radiation angle of the light source.

DETAILED DESCRIPTION OF THE INVENTION

Figure 1:
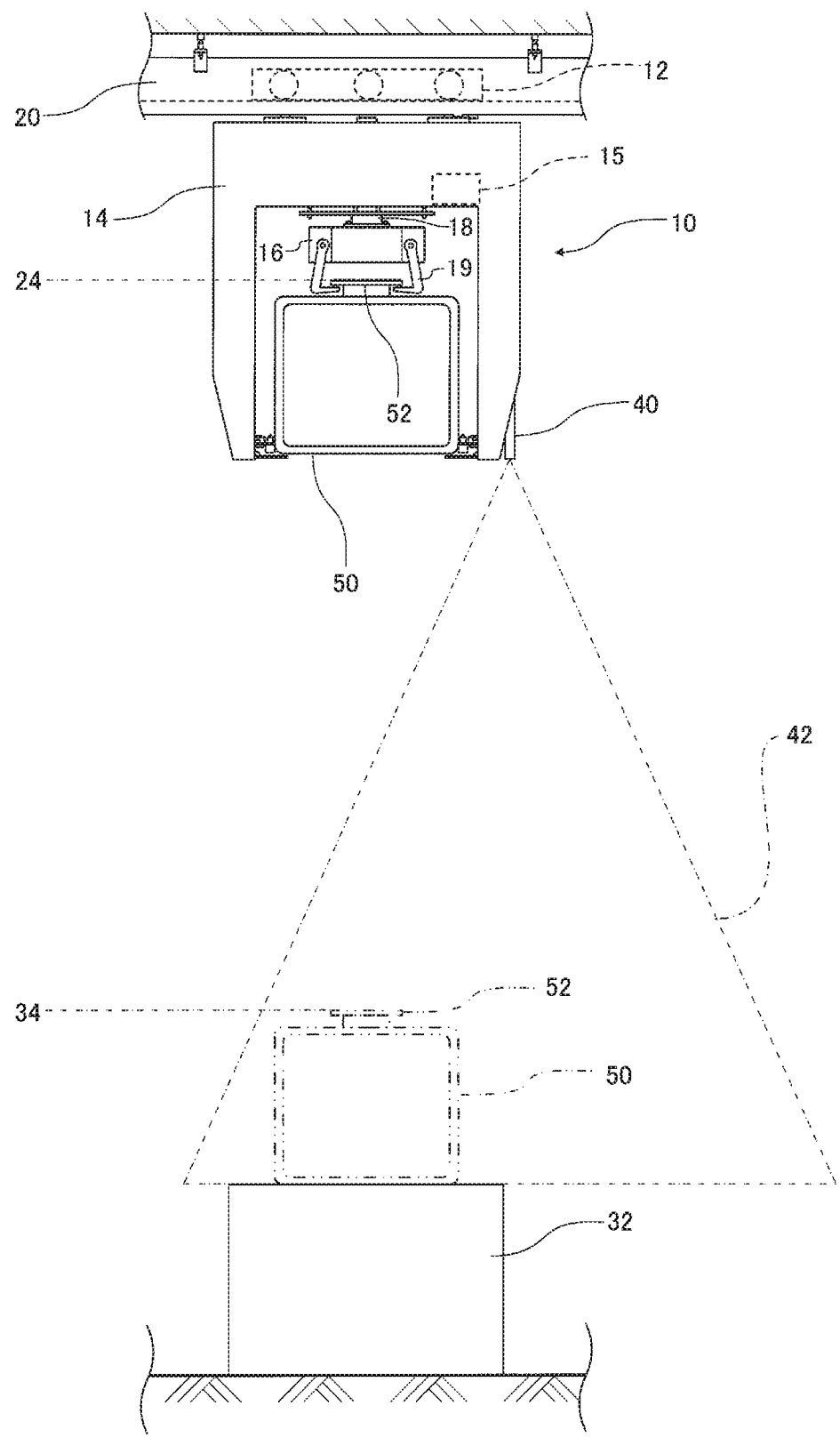
FIG. 1 is a side view illustrating an overhead conveyance vehicle and an article mount in an example of an embodiment according to the present invention.

FIG. 1 illustrates an example of an embodiment of an overhead conveyance vehicle according to the present invention. In a facility (e.g., a semiconductor manufacturing facility) where an overhead conveyance vehicle 10 is used, a rail 20 is mounted as a conveyance track on the ceiling and a carriage 12 on the overhead conveyance vehicle 10 travels along the rail 20. The carriage 12 is coupled to a body 14 of the overhead conveyance vehicle 10. The body 14 includes an elevating unit 16. The elevating unit 16 is provided with a hoist mechanism 18, allowing the elevating unit 16 to ascend and descend between the ceiling side and the floor side of the facility.

An article mount 32 is provided on the floor of the facility. On the article mount 32, a magazine 50 conveyed as an article (e.g., a so-called front-opening unified pot (FOUP) as a semiconductor wafer carrier) in the facility can be stably placed. For example, the load port of semiconductor manufacturing equipment acts as the article mount 32.

The elevating unit 16 can hold the magazine 50 with arms 19 and a chuck or the like and can hoist (move up) and lower (move down) the magazine 50 between a conveyance position 24 in the body 14 (ceiling side) and a transfer position 34 above the article mount 32 (floor side). Specifically, the elevating unit 16 can perform a catching operation and a releasing operation. In the catching operation, the elevating unit 16 before holding the magazine 50 moves downward from the conveyance position 24 to the transfer position 34. A top flange 52 on the magazine 50 placed at the transfer position 34 on the article mount 32 is then held by the arms 19 of the elevating unit 16, so that the magazine 50 is held by the elevating unit 16.

In the releasing operation, the elevating unit 16 holding the magazine 50 moves down from the conveyance position 24 to the transfer position 34 above the article mount 32 and then the magazine 50 held by the elevating unit 16 is released, so that the magazine 50 is placed on the article mount 32.

In the overhead conveyance vehicle 10 of the present embodiment, a camera 40 acting as an imaging device is provided under the body 14 and outside the hoisting/lowering path of the elevating unit 16. The camera 40 is directed downward so as to capture an image below the body 14. An imaging range 42 to be included in an image captured by the camera 40 extends downwardly. At the height of the article mount 32, a wide range including the placed magazine 50 is contained in the imaging range 42 as illustrated in FIG. 1. The imaging range 42 may extend not only to the article mount 32 but also to an area around the article mount 32 (outside the article mount 32).

The overhead conveyance vehicle 10 further includes a controller 15 (e.g., a processor) that controls the operation of the overhead conveyance vehicle 10. The controller 15 controls the traveling of the carriage 12, the catching and releasing operations of the elevating unit 16, and image processing on an image captured by the camera 40. In FIG. 1, the controller 15 is contained in the body 14. The controller 15 may be a separate device such as a computer for controlling the operation of the overhead conveyance vehicle 10 via communications.

The controller 15 can switch between a conveying operation in which the overhead conveyance vehicle 10 travels along the rail 20 and the catching or releasing operation in which the overhead conveyance vehicle 10 stops the traveling to hoist or lower the elevating unit 16, depending upon the current position of the overhead conveyance vehicle 10. For example, in a semiconductor facility, a host unit operated by the manager of the facility may specify which one of the magazines 50 is to be placed on the article mount 32 (load port) or specify which one of the article mounts 32 is to bear the magazine 50 and which one of the overhead conveyance vehicles 10 is to convey the magazine 50. In this case, the controller 15 receives specifying information from the host unit and stops the traveling of the carriage 12 and starts the catching or releasing operation when the overhead conveyance vehicle 10 reaches above the article mount 32 to bear the magazine 50 currently held (conveyed) by the overhead conveyance vehicle 10 or reaches above the article mount 32 on which the magazine 50 to be conveyed by the overhead conveyance vehicle 10 is placed. Before hoisting or lowering the elevating unit 16 in order to perform the catching or releasing operation, the controller 15 captures a reference image by using the camera 40. The reference image indicates a state below the body 14 at the start of the operation.

Figure 2:
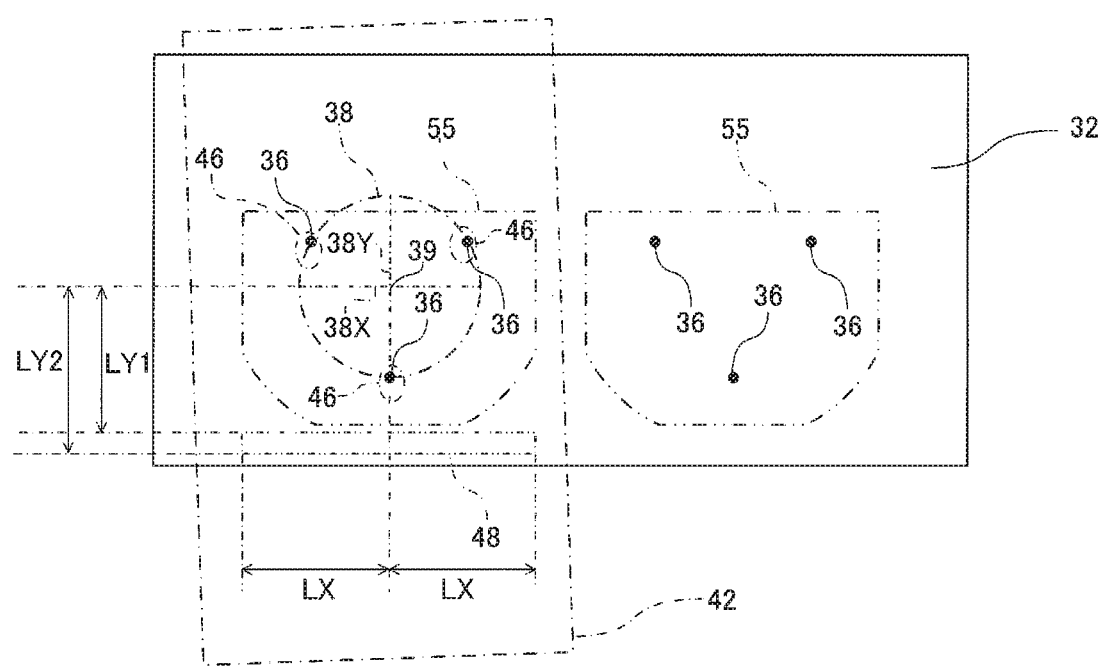
FIG. 2 is a plan view illustrating the top surface of the article mount and locating pins provided on the article mount.

For example, at the start of the releasing operation, the magazine 50 is not placed on the article mount 32 below the overhead conveyance vehicle 10 and the top surface of the article mount 32 is exposed. The plan view of FIG. 2 illustrates a state of the top surface of the article mount 32.

The top surface of the article mount 32 has locating pins 36 that are indicators serving as the marks of a target position 55 of the magazine 50 to be placed. In the case of the load port of the semiconductor manufacturing facility, the layout and shapes of the locating pins 36 are defined by standards. For example, a set of three pins that are circular in plan view and project upward is embedded into the top surface of the article mount 32 so as to form the vertices of a regular triangle. The set of pins corresponds to the target position 55. Two target positions 55 are prepared on the article mount 32 of FIG. 2.

In the following description, the releasing operation is performed on the left target position 55 in FIG. 2. First, the reference image of the imaging range 42 including the target position 55 is captured by the camera 40. The controller 15 performs image processing on the reference image and searches for the locating pins (three locating pins) 36 included in the image. For example, if the article mount 32 is metallic with the top surface having silver color by metallic luster while the locating pins 36 are blackened, the controller 15 searches for black round portions in the silver background. If the locating pin 36 has different colors, for example, the head of the locating pin 36 is white while the tail of the locating pin 36 is black, the controller 15 searches for black and white double circles.

overall imaging range 42 may be searched for the locating pins 36. To shorten the search time, a search range may be determined in advance in the image. For example, three oval search ranges 46 in FIG. 2 may be searched for the locating pins 36. The search ranges 46 are preferably set to define any images, for example, "an oval figure in a predetermined shape centered at a point which is at the X-th pixel from the left end of the image and is at the Y-th pixel from the lower end of the image."

If the controller 15 finds a predetermined number of (three) locating pins 36, the controller 15 determines a monitoring range 48 based on the positions of the locating pins 36. The monitoring range 48 is monitored to determine the presence or absence of an obstacle. For example, the controller 15 calculates a central coordinate 39 of a virtual circle 38 passing through the three locating pins 36 and determines the monitoring range 48 at a predetermined distance from the central coordinate 39.

The controller 15 can also calculate the directions of a transverse axis 38X and an anteroposterior axis 38Y of the virtual circle 38 from the positions of the three locating pins 36. The directions of the transverse axis 38X and the anteroposterior axis 38Y of the virtual circle 38 correspond to the desirable orientation of the magazine 50 when the magazine 50 is placed at the target position 55. In FIG. 2, the orientation of the camera 40 is displaced so as to incline the orientation of the imaging range 42 from the directions of the transverse axis 38X and the anteroposterior axis 38Y of the virtual circle 38. Even if the imaging range 42 is inclined, the controller 15 can calculate the desirable directions of the transverse axis 38X and the anteroposterior axis 38Y based on the positions of the three locating pins 36.

As described above, when the monitoring range 48 is defined as a range at the predetermined distance from the central coordinate 39, the monitoring range 48 is desirably set at distances in parallel with the calculated directions of the transverse axis 38X and the anteroposterior axis 38Y of the virtual circle 38 instead of distances along the length and width of the image in consideration of the possibility of inclination of the imaging range 42. In FIG. 2, the monitoring range 48 is a rectangular range that is extended in the direction of the transverse axis 38X by a distance LX to each of the right and left sides from the central coordinate 39 of the virtual circle 38 and is extended in the direction of the anteroposterior axis 38Y from a position at a distance LY1 from the central coordinate 39 to a position at a distance LY2 from the central coordinate 39. As illustrated in FIG. 2, the monitoring range 48 is set outside the target position 55.

At the start of the catching operations, the magazine 50 is placed on the article mount 32 below the overhead conveyance vehicle 10 and thus the camera 40 captures an image of the top surface of the magazine 50. If the magazine 50 is, for example, a front-opening unified pot (FOUP) serving as a semiconductor wafer carrier, the shape and dimensions of the magazine 50 are defined in advance by the standards. In particular, the contour shape of the top flange 52 held by the arms 19 or the chuck of the elevating unit 16 is defined as a standardized shape.

Thus, in the catching operation, a shape similar to the standardized shape of the top flange 52 is searched for in the captured reference image and is defined as an indicator part. The plan view of FIG. 3 illustrates an example of a specific shape of the top surface of the magazine 50, in particular, the contour shape of the top flange 52.

The contour shape has a plurality of notches in characteristic shapes and thus the location of the top flange 52 can be substantially ensured in the presence of a shape similar to the overall shape. However, if the article mount 32 and the magazine 50 are both silver with few color differences or if the top flange 52 is not sufficiently illuminated with the lighting of the facility, it is difficult to accurately search for the overall shape. Thus, in this case, the controller 15 searches for a shape at multiple points and detects some of the points so as to determine the position of the top flange 52.

Figure 3:
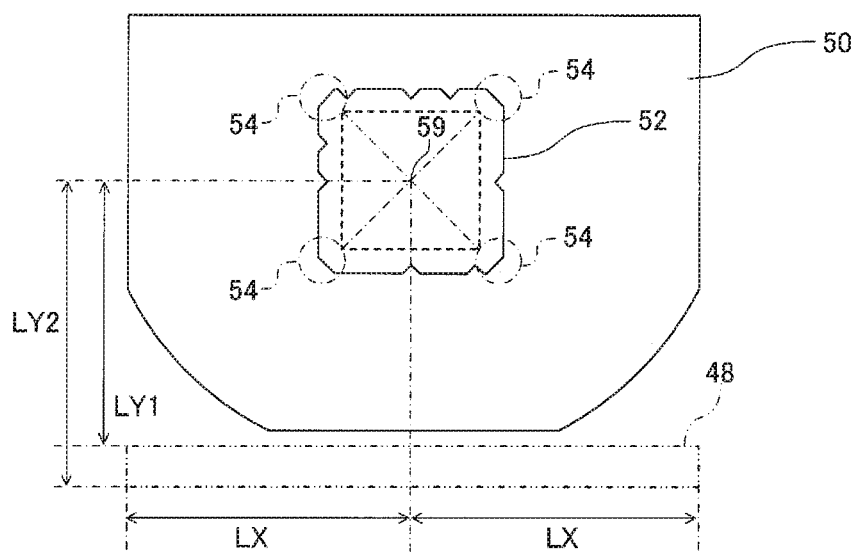
FIG. 3 is a plan view illustrating the shape of a magazine including a top flange.

Specifically, the controller 15 searches for four corners 54 of the top flange 52 illustrated in FIG. 3. The four corners 54 also have characteristic shapes and thus it can be determined that the position of the top flange 52 is located when similar shapes are detected. In addition to the four corners 54, the controller 15 can also search for notched shapes on the sides of the top flange 52.

For example, if the upper right corner and the lower left corner or the upper left corner and the lower right corner, that is, two corners on a diagonal line are detected from among the four corners 54, it can be determined that the position of the top flange 52 is located. As has been discussed, the contour shape of the top flange 52 is determined by the standards and thus only by detecting and locating a part serving as an indicator part, the positions of the other parts of the top flange 52 can be also calculated. The controller 15 calculates the position of a center point 59 of the top flange 52 based on the detected positions of the four corners 54. Subsequently, a range at a predetermined distance from the center point 59 is defined as the monitoring range 48. In FIG. 3, the monitoring range 48 is a rectangular range that is extended by a distance LX to each of the right and left sides from the center point 59 and is extended from a position at a distance LY1 from the center point 59 to a position at a distance LY2 from the center point 59. As illustrated in FIG. 3, the monitoring range 48 is set outside the magazine 50.

Figure 4:
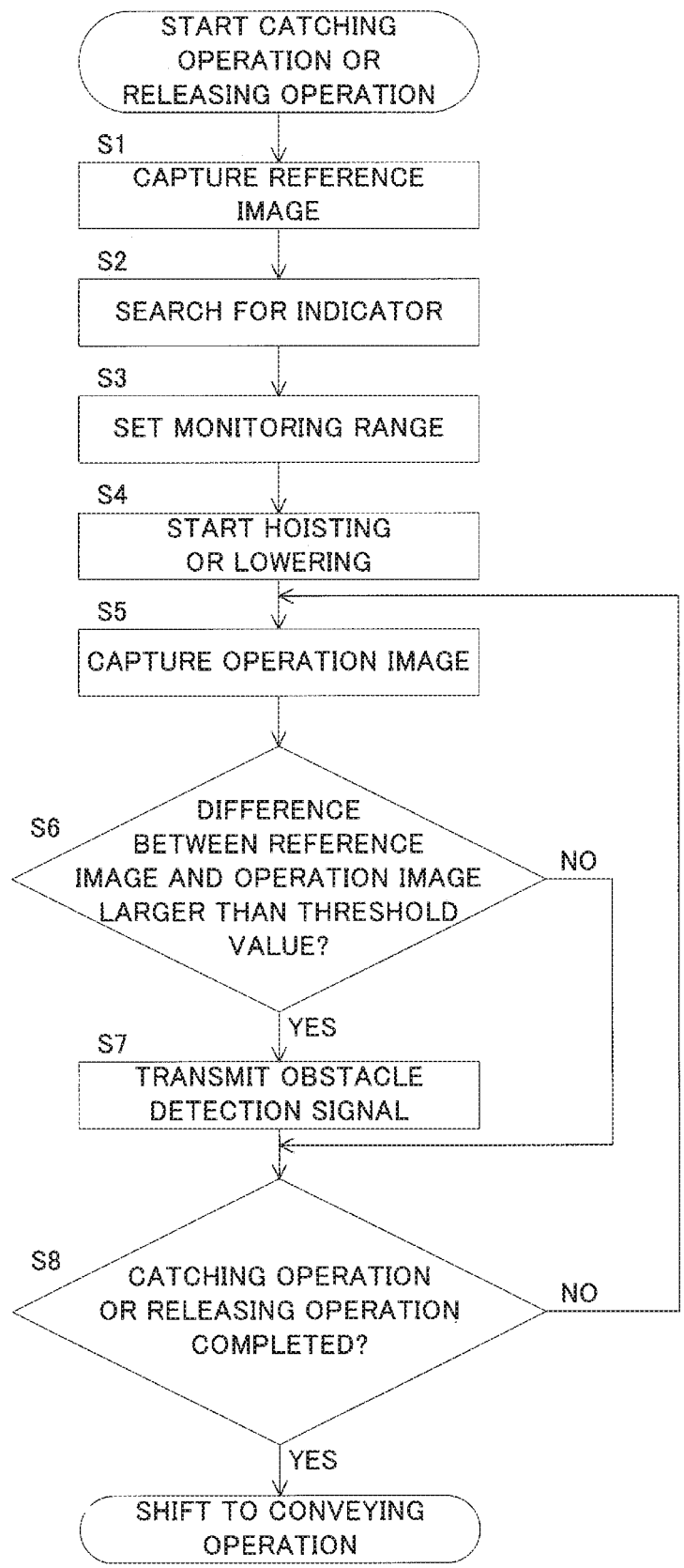
FIG. 4 is a flowchart of the steps of detecting an obstacle.

As has been discussed, at the start of the catching operation or the releasing operation, processing for capturing the reference image (step S1 in FIG. 4), processing for an indicator search in which the reference image is searched for an indicator or an indicator part (step S2), and processing for setting the monitoring range 48 (step S3) are performed. When the monitoring range 48 is set, the hoist mechanism 18 starts hoisting or lowering (moving up or down) of the elevating unit 16 (step S4).

When the hoisting or lowering operation is started, the controller 15 captures an operation image by using the camera 40, the operation image indicating a state of the top surface of the article mount 32 during the hoisting or lowering operation (step S5). Subsequently, it is determined whether a difference is made between the operation image and the reference image in the monitoring range 48 (step S6).

Step S6 will be specifically described below. Since the monitoring range 48 is set outside the target position 55 or the magazine 50, the monitoring range 48 only includes the top surface of the article mount 32 during the catching operation or the releasing operation and thus inevitably remains constant (no change from the state of the reference image). If an image in the monitoring range 48 is changed during the operation, it is assumed that an obstacle (e.g., a hand of an operator) has entered the monitoring range 48. Thus, in step S6, it is determined whether a difference is made between the operation image and the reference image in the monitoring range 48. In this case, a small difference is tolerated because a color difference may be slightly made by small vibrations from devices or a change of lighting conditions even if an obstacle is not present. In the case of a difference larger than a predetermined threshold value (e.g., 40 pixels) (step S6—YES), it is determined that an obstacle is present.

If it is determined that an obstacle is present, the controller 15 transmits an obstacle detection signal to the elevating unit 16 and the host unit (step S7). Actual processing in the presence of an obstacle varies among facilities. For example, the operation may be stopped until the obstacle is removed, or the operation may be continued after "obstacle detection" is recorded.

After the obstacle detection signal is transmitted or if any difference between the operation image and the reference image does not exceed the threshold value (step S6—NO), the controller 15 determines whether the catching operation or the releasing operation is completed (step S8). For example, the completion of the operation can be determined by checking whether the elevating unit 16 is returned into the body 14 and the magazine 50 is held. The checking is enabled by, for example, measuring the weight of the elevating unit 16 by a weight scale provided for the overhead conveyance vehicle 10.

If the catching operation or the releasing operation is completed (step S8—YES), the controller 15 restarts the driving of the stopped carriage 12 and shifts to a conveying operation of running along the rail. If the catching operation or the releasing operation is not completed (step S8—NO), the foregoing operation is repeated from the capturing of the operation image (return to step S5). In this way, the overhead conveyance vehicle 10 of the present embodiment can perform the catching operation and the releasing operation while determining the presence or absence of an obstacle.

Steps S1 to S8 only determine the presence or absence of an obstacle by a comparison between the reference image and the operation image. The history of determination may be stored as a record. For example, the overhead conveyance vehicle 10 may include image memory for recording obtained image data. Furthermore, the overhead conveyance vehicle 10 preferably includes a clocking device for measuring a current time or a timer for measuring an elapsed time from the start of an operation on the day.

For example, when the reference image is captured in step S1 or when the operation image is captured in step S5, data on the captured image is recorded with the imaging time in image memory. In other words, the imaging time of the image is recorded. The recording of the imaging time allows a facility manager to match the recorded image data with the imaging time when an obstacle appears. Thus, the facility manager can recognize the step where the obstacle has appeared. Since the image is recorded, the facility manager can identify the obstacle later. In a specific example, whether an operator has interrupted the camera 40 or erroneous detection has occurred can be examined based on an image serving as an evidence. The camera 40 is an imaging device for checking the presence or absence of an obstacle during an operation, that is, a device for providing safety. The device for safety can be also used as a device for recording the history of operations.

The overhead conveyance vehicle 10 can detect all objects included in the imaging range 42 captured by the camera 40. Thus, even a small obstacle fitting into the middle of a projection pitch (fixed angle) can be detected, though such a small obstacle may be undetectable by the optical obstacle sensor of the related art.

The optical obstacle sensor of the related art requires a driving mechanism that may be mechanically worn to adjust a radiation angle, resulting in a short life. In contrast, the camera 40 is an imaging device that does not require a driving unit, increasing the life of the device.

In the embodiment, the search range 46 and the monitoring range 48 in FIG. 2 are automatically set. Alternatively, the controller 15 may transmit a captured image to a device, e.g., an external console for adjustment and then an operator may manually set the ranges with the console for adjustment while confirming the actually captured image. Also in this case, the device for determining the presence or absence of an obstacle can be adjusted only by changing the setting by the operator who is visually checking the image. This eliminates the need for an operation that involves a lot of work and effort unlike in the optical obstacle sensor of the related art. For example, the operator does not have to climb up to a high place to manually adjust the radiation angle of the light source.

In the present embodiment, when the magazine 50 is not present on the article mount 32 in the releasing operation, the monitoring range 48 is set by using the locating pins 36 as indicators. Also in the catching operation, that is, when the magazine 50 is placed on the article mount 32, the monitoring range 48 can be determined by using markers as indicators if the markers are provided in a predetermined layout on the top surface of the magazine 50.

In the present embodiment, when the magazine 50 is placed on the article mount 32 in the catching operation, the monitoring range 48 is set by using the standardized shape of the top flange 52 of the magazine 50 as an indicator part. Also in the releasing operation, that is, even when the magazine 50 is not present on the article mount 32, the monitoring range 48 can be determined by using the shape of a marker as an indicator part if the marker is provided in a predetermined shape on the top surface of the article mount 32.

In the present embodiment, the presence or absence of an obstacle is determined by checking the state of the monitoring range 48 in the imaging range 42. The presence or absence of an obstacle can be also determined all over the imaging range 42 (the article mount 32 and an area around the article mount 32) by using an AI or an image analysis program etc. that can distinguish between an obstacle and the magazine 50 (an object other than an obstacle that may be captured in an image in a normal operation) such as by analyzing a contour shape in an image.

REFERENCE SIGNS LIST 10 overhead conveyance vehicle
16 elevating unit
32 article mount
36 locating pin
40 camera
42 imaging range
48 monitoring range
50 magazine
52 top flange

What is claimed is:

1. An overhead conveyance vehicle that travels along a conveyance track mounted on a ceiling and conveys a target article along the conveyance track, the overhead conveyance vehicle comprising:
   a carriage that travels along the conveyance track;
   a body that moves with the carriage along the conveyance track;

an elevating unit that is provided in the body and is capable of moving up and down between a conveyance position and a transfer position below the conveyance position;

an imaging device that captures an image below the body; and a controller that controls an operation of the overhead conveyance vehicle, wherein the elevating unit is capable of performing a catching operation so as to move down to the transfer position and hold the article placed on an article mount below the conveyance position and a releasing operation so as to move down with the article held at the conveyance position to the transfer position and place the article on the article mount, and when controlling the elevating unit to perform one of the catching operation and the releasing operation, the controller determines, based on the image captured by the imaging device, presence or absence of an obstacle in an imaging range captured by the imaging device, wherein when controlling the elevating unit to perform one of the catching operation and the releasing operation, the controller searches the image captured by the imaging device for a plurality of predetermined indicators and sets, with reference to positions of the indicators, a monitoring range for determining the presence or absence of an obstacle.

2. The overhead conveyance vehicle according to claim 1, wherein when controlling the elevating unit to perform one of the catching operation and the releasing operation, the controller searches the image captured by the imaging device for a shape similar to a predetermined standardized shape, defines the shape as an indicator part, and sets, with reference to a position of the indicator part, a monitoring range for determining the presence or absence of an obstacle.

3. The overhead conveyance vehicle according to claim 1, wherein an image captured by the imaging device at start of one of the catching operation and the releasing operation is set as a reference image while an image captured by the imaging device during one of the catching operation and the releasing operation is set as an operation image, and if a difference larger than a predetermined threshold value is made between image data in the monitoring range in the reference image and image data in the monitoring range in the operation image, the controller determines that an obstacle is present in the imaging range.

4. The overhead conveyance vehicle according to claim 1, wherein when controlling the elevating unit to perform one of the catching operation and the releasing operation, the controller records the image captured by the imaging device with an imaging time of the image.

5. The overhead conveyance vehicle according to claim 2, wherein an image captured by the imaging device at start of one of the catching operation and the releasing operation is set as a reference image while an image captured by the imaging device during one of the catching operation and the releasing operation is set as an operation image, and if a difference larger than a predetermined threshold value is made between image data in the monitoring range in the reference image and image data in the monitoring range in the operation image, the controller determines that an obstacle is present in the imaging range.

6. The overhead conveyance vehicle according to claim 1, wherein when controlling the elevating unit to perform one of the catching operation and the releasing operation, the controller records the image captured by the imaging device with an imaging time of the image.

7. The overhead conveyance vehicle according to claim 2, wherein when controlling the elevating unit to perform one of the catching operation and the releasing operation, the controller records the image captured by the imaging device with an imaging time of the image.

8. The overhead conveyance vehicle according to claim 3, wherein when controlling the elevating unit to perform one of the catching operation and the releasing operation, the controller records the image captured by the imaging device with an imaging time of the image.

9. An overhead conveyance vehicle that travels along a conveyance track mounted on a ceiling and conveys a target article along the conveyance track, the overhead conveyance vehicle comprising:

a carriage that travels along the conveyance track;

a body that moves with the carriage along the conveyance track;

an elevating unit that is provided in the body and is capable of moving up and down between a conveyance position and a transfer position below the conveyance position;

an imaging device that captures an image below the body; and a controller that controls an operation of the overhead conveyance vehicle, wherein the elevating unit is capable of performing a catching operation so as to move down to the transfer position and hold the article placed on an article mount below the conveyance position and a releasing operation so as to move down with the article held at the conveyance position to the transfer position and place the article on the article mount, and when controlling the elevating unit to perform one of the catching operation and the releasing operation, the controller determines, based on the image captured by the imaging device, presence or absence of an obstacle in an imaging range captured by the imaging device, and wherein when controlling the elevating unit to perform one of the catching operation and the releasing operation, the controller searches the image captured by the imaging device for a shape similar to a predetermined standardized shape, defines the shape as an indicator part, and sets, with reference to a position of the indicator part, a monitoring range for determining the presence or absence of an obstacle.

10. The overhead conveyance vehicle according to claim 9, wherein an image captured by the imaging device at start of one of the catching operation and the releasing operation is set as a reference image while an image captured by the imaging device during one of the catching operation and the releasing operation is set as an operation image, and if a difference larger than a predetermined threshold value is made between image data in the monitoring range in the reference image and image data in the monitoring range in the operation image, the controller determines that an obstacle is present in the imaging range.

11. The overhead conveyance vehicle according to claim 9, wherein when controlling the elevating unit to perform one of the catching operation and the releasing operation, the controller records the image captured by the imaging device with an imaging time of the image.

* * * * *